(12) United States Patent
Kintis

(10) Patent No.: US 7,308,234 B2
(45) Date of Patent: Dec. 11, 2007

(54) FEEDFORWARD SPUR CANCELLATION APPROACH USING LOW IP AMPLIFIER

(75) Inventor: Mark Kintis, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 505 days.

(21) Appl. No.: 11/038,333

(22) Filed: Jan. 19, 2005

(65) Prior Publication Data

US 2006/0160502 A1   Jul. 20, 2006

(51) Int. Cl.
*H04B 1/04* (2006.01)
*H03F 1/26* (2006.01)
*H03F 1/00* (2006.01)

(52) U.S. Cl. .............................. 455/114.1; 455/114.2; 455/296; 330/149; 330/151

(58) Field of Classification Search ............. 455/114.1, 455/114.2, 114.3, 63.1, 295, 296; 330/149, 330/151
See application file for complete search history.

(56) References Cited

U.S. PATENT DOCUMENTS

| | | | | |
|---|---|---|---|---|
| 3,275,806 A | * | 9/1966 | Quinn et al. .................. | 235/494 |
| 4,130,807 A | * | 12/1978 | Hall et al. .............. | 330/124 R |
| 4,348,642 A | * | 9/1982 | Harrington .................. | 330/149 |
| 4,389,618 A | * | 6/1983 | Bauman ..................... | 330/149 |
| 4,394,624 A | * | 7/1983 | Bauman ..................... | 330/151 |
| 4,943,783 A | * | 7/1990 | Nojima ....................... | 330/149 |
| 5,077,532 A | * | 12/1991 | Obermann et al. ......... | 330/151 |
| 5,157,345 A | * | 10/1992 | Kenington et al. ......... | 330/149 |
| 5,166,634 A | * | 11/1992 | Narahashi et al. .......... | 330/151 |
| 5,327,096 A | * | 7/1994 | Sakamoto et al. .......... | 330/151 |
| 5,386,198 A | * | 1/1995 | Ripstrand et al. ............ | 330/52 |
| 5,485,120 A | * | 1/1996 | Anvari ....................... | 330/151 |
| 5,489,875 A | * | 2/1996 | Cavers ....................... | 330/151 |
| 5,508,657 A | * | 4/1996 | Behan ........................ | 330/151 |

(Continued)

FOREIGN PATENT DOCUMENTS

EP    0 621 684 A1    4/1994

(Continued)

OTHER PUBLICATIONS

Madani, K., Reducing the Intermodulation Distortion in Multi-Carrier Microwave Power Amplifiers, 1999 IEEE, pp. 153-157.

*Primary Examiner*—Duc M. Nguyen
(74) *Attorney, Agent, or Firm*—John A. Miller; Miller IP Group, PLC

(57) ABSTRACT

A power amplifier circuit (40) that includes an error correction loop (44) having a lower IP3 error correction amplifier (54) than a main power amplifier (46) in a main signal path (48). A first attenuator (52) in the error loop (44) attenuates the RF signal, and provides more attenuation of intermodulation products in the RF signal and about the same attenuation for a main frequency of the RF signal for each dB of attenuation. The error amplifier (54) amplifies the attenuated RF signal from the first attenuator (52). A second attenuator (56) in the error loop (44) attenuates the RF signal from the error correction amplifier (54). A phase shifter (58) phase shifts the RF signal from the second attenuator (56). A coupler (50) couples the amplified RF signal and the phase shifted RF signal to cancel out intermodulation products in the amplified RF signal.

24 Claims, 2 Drawing Sheets

U.S. PATENT DOCUMENTS

| | | | |
|---|---|---|---|
| 5,576,659 A * | 11/1996 | Kenington et al. | 330/52 |
| 5,789,976 A * | 8/1998 | Ghannouchi et al. | 330/52 |
| 5,796,307 A * | 8/1998 | Kumagai et al. | 330/149 |
| 5,963,090 A * | 10/1999 | Fukuchi | 330/149 |
| 5,977,826 A | 11/1999 | Behan et al. | |
| 6,133,791 A * | 10/2000 | Horiguchi et al. | 330/151 |
| 6,275,105 B1 * | 8/2001 | Ghannouchi et al. | 330/151 |
| 6,320,464 B1 * | 11/2001 | Suzuki et al. | 330/151 |
| 6,507,731 B1 * | 1/2003 | Hasegawa | 455/115.3 |
| 6,525,603 B1 * | 2/2003 | Morgan | 330/52 |
| 6,573,792 B1 * | 6/2003 | Olson et al. | 330/151 |
| 6,734,726 B2 * | 5/2004 | Billsberry | 330/52 |
| 6,744,316 B2 * | 6/2004 | Louis et al. | 330/151 |
| 6,794,933 B2 * | 9/2004 | Gurvich et al. | 330/52 |
| 6,819,175 B2 * | 11/2004 | Kemna | 330/151 |
| 6,836,671 B2 * | 12/2004 | Haigh et al. | 455/561 |
| 6,850,115 B2 * | 2/2005 | Gurvich et al. | 330/151 |
| 6,920,334 B1 * | 7/2005 | Karsi et al. | 455/522 |
| 6,931,080 B2 * | 8/2005 | Giardina et al. | 375/296 |
| 7,058,368 B2 * | 6/2006 | Nicholls et al. | 455/114.2 |
| 7,091,782 B2 * | 8/2006 | Jacob | 330/151 |
| 7,248,112 B2 * | 7/2007 | Itahara | 330/149 |

FOREIGN PATENT DOCUMENTS

| | | |
|---|---|---|
| EP | 0 986 168 A2 | 3/2000 |
| EP | 1 309 082 A2 | 5/2003 |

* cited by examiner

FEEDFORWARD SPUR CANCELLATION APPROACH USING LOW IP AMPLIFIER

BACKGROUND OF THE INVENTION

1. Field of the Invention

This invention relates generally to a power amplifier employing a technique for spurious signal cancellation and, more particularly, to a power amplifier employing a feed forward error correction amplifier having a low IP3 value for generating greater magnitude intermodulation products to cancel spurious signals in an RF signal.

2. Discussion of the Related Art

Communications systems that transmit RF signals carrying information typically employ linear power amplifiers to amplify the transmit signal so that it has enough power to be received and deciphered by a receiver at a distant location. Nonlinearities within the power amplifier introduce signal harmonics, intermodulation products and other distortions and spurious counterparts of the RF signal that cause interfering signals to other frequency channels. The signal harmonics can typically be filtered out, but the intermodulation products and other spurious signals are generally too close to the main center frequency of the signal to be filtered. Thus, it is desirable to provide techniques to cancel the spurious signals produced by the power amplifier in the transmitter.

FIG. 1 is a schematic diagram of a known amplifier circuit 10 that amplifies an RF signal to be transmitted and cancels spurious signals in the amplified RF signal produced by the amplification process. The circuit 10 includes a signal splitter 12 that splits off a sample of the RF signal to be amplified and directs it onto a feed forward signal path 16. Most of the RF signal is directed onto a main signal path 14 where it is amplified for transmission by a power amplifier 18. In one example, the amplifier 18 is a high gain, high intermodulation performance amplifier that generates third order intermodulation products (IP3). The output power spectrum of the RF signal from the amplifier 18 includes both the amplified RF input signal and the third order intermodulation products produced by the amplification process. The amplified RF signal from the amplifier 18 is applied to a directional coupler 20 that couples off a portion of the amplified RF signal that includes the intermodulation products. The magnitude of the main frequency of the RF signal coupled off by the coupler 20 is about the same as the magnitude of the RF signal directed on to the feed forward signal path 16 by the splitter 12.

The sampled RF signal on the feed forward path 16 is applied to a phase shifter 22 that inverts or phase shifts the sampled RF signal to be 180° out of phase with the RF signal on the main signal path 14. The RF signal from the coupler 20 and the phase shifted RF signal from the phase shifter 22 are summed by a summer 24 where the main frequency in the signals is cancelled. Thus, the RF signal from the summer 24 includes only the intermodulation products of the RF signal from the coupler 20. In other words, because the phase shifted RF signal from the phase shifter 22 does not include the intermodulation products generated by the power amplifier 18, the main part of the RF signal from the coupler 20 is cancelled in the summer 24.

The intermodulation products signal from the summer 24 is amplified by an error amplifier 26. The output of the amplifier 26 is the intermodulation products of the RF signal that has a magnitude close to the magnitude of the intermodulation products in the amplified signal from the amplifier 18 that is left on the main signal path 14 after the coupler 20. The amplified intermodulation product signal from the amplifier 26 is sent through a variable attenuator 28 that reduces the intensity of the intermodulation products signal to a level more closely matched to the magnitude of the intermodulation products in the amplified signal from the amplifier 18.

The amplified and attenuated intermodulation products signal from the attenuator 28 is applied to a variable phase shifter 30 that selectively phase shifts the signal to be 180° out of phase with the RF signal on the main signal path 14. The inverted intermodulation products signal from the phase shifter 30 is then coupled to the amplified RF signal on the main signal path 14 by a coupler 32. The intermodulation products in the amplified RF signal from the amplifier 20 are thus cancelled by the phase shifted and intensity controlled intermodulation products signal from the phase shifter 30. Therefore, the output of the coupler 32 is an amplified RF signal with little or no intermodulation products. A controller 34 controls the circuit 10, and sets the attenuation provided by the attenuator 24 and the phase shift provided by the phase shifter 30.

The circuit 10 suffers from a number of problems and drawbacks. These problems include the requirement of a large number of directional couplers and signal splitters to sample the RF signal at the input, after the power amplifier 18, and at the output of the circuit 10 that increase the complexity of the circuit 10. Another disadvantage includes the requirement of the high linearity error amplifier 26 so that the feed forward path 16 does not produce significant additional spurious signals from the high power amplification process.

SUMMARY OF THE INVENTION

In accordance with the teachings of the present invention, a power amplifier circuit for amplifying an RF signal is disclosed that includes a feed forward error correction loop that employs an error correction amplifier having a lower IP3 value than a main power amplifier in a main signal path. The circuit includes a splitter for splitting the RF signal into a main RF signal directed onto the main signal path and a sampled RF signal directed onto the error correction loop. The error correction amplifier generates greater amplitude intermodulation products of the sampled RF signal than the amplitude of the intermodulation products generated by the main power amplifier relative to the gain of the main frequency of the RF signal. The magnitude of the main frequency of the main RF signal is substantially greater than the magnitude of the main frequency of the sampled RF signal, and the magnitude of the intermodulation products of the main RF signal and the sampled RF signal are about the same.

A first variable attenuator is provided in the error correction loop for attenuating the sampled RF signal. A second variable attenuator is provided in the error correction loop for attenuating the amplified and sampled RF signal from the error correction amplifier. The first attenuator provides more attenuation of the intermodulation products in the sampled RF signal and about the same attenuation for the main frequency of the sampled RF signal for each dB of attenuation. The second attenuator provides the same amount of attenuation for both the intermodulation products and the main frequency of the sampled RF signal for each dB of attenuation.

A phase shifter phase shifts the sampled RF signal from the second attenuator to be 180° out of phase with the main RF signal. A coupler is provided in the main signal path for coupling the amplified main RF signal from the main power amplifier and the phase shifted sampled RF signal from the phase shifter to cancel out the intermodulation products in the amplified main RF signal.

Additional advantages and features of the present invention will become apparent from the following description and appended claims, taken in conjunction with the accompanying drawings.

DETAILED DESCRIPTION OF THE EMBODIMENTS

The following discussion of the embodiments of the invention directed to an RF power amplifier employing a feed forward error correction loop having two variable attenuators is merely exemplary in nature, and is in no way intended to limit the invention or its applications or uses.

Figure 1:
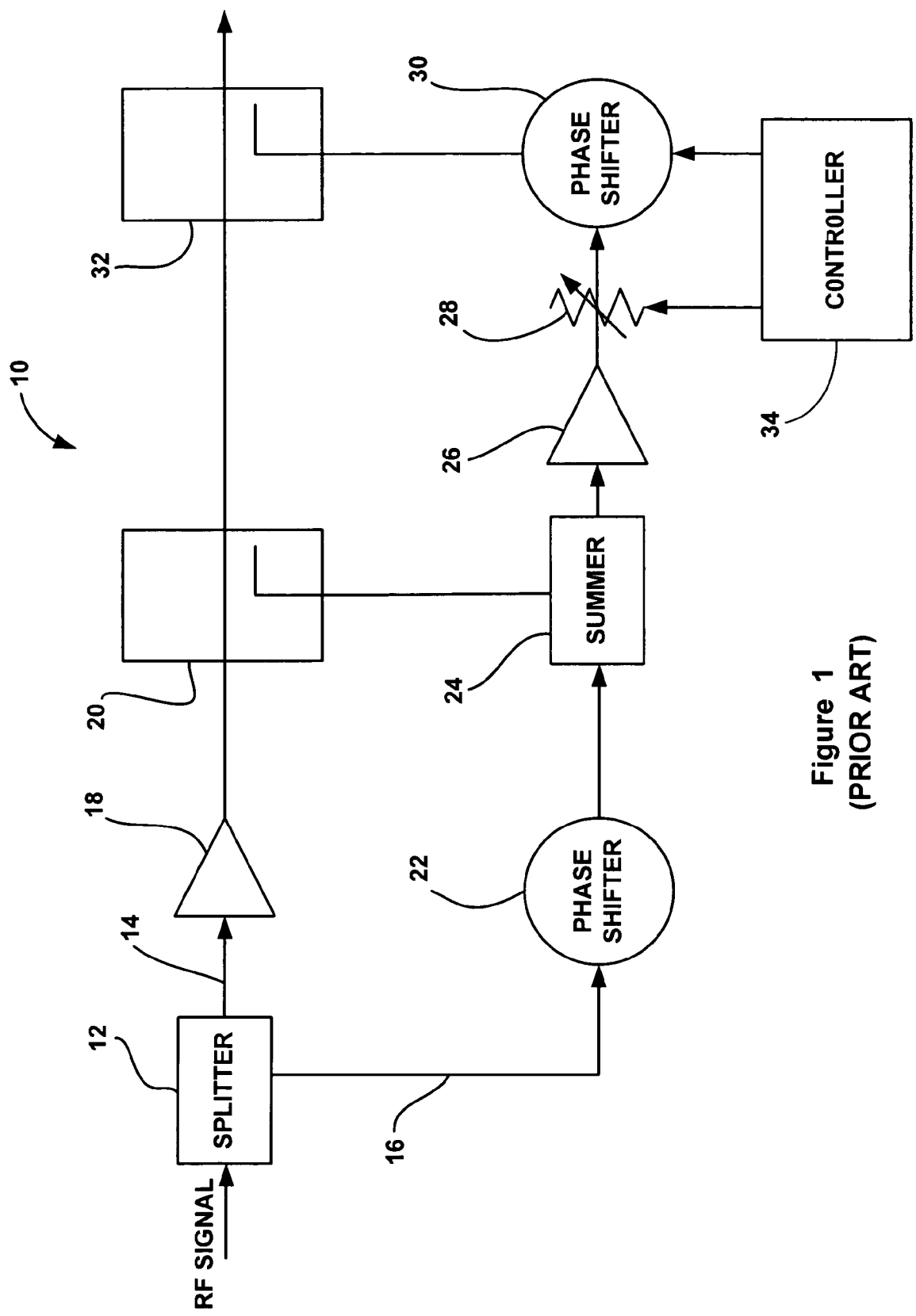
FIG. 1 is a schematic block diagram of a known power amplifier circuit for amplifying an RF signal.
Figure 2:
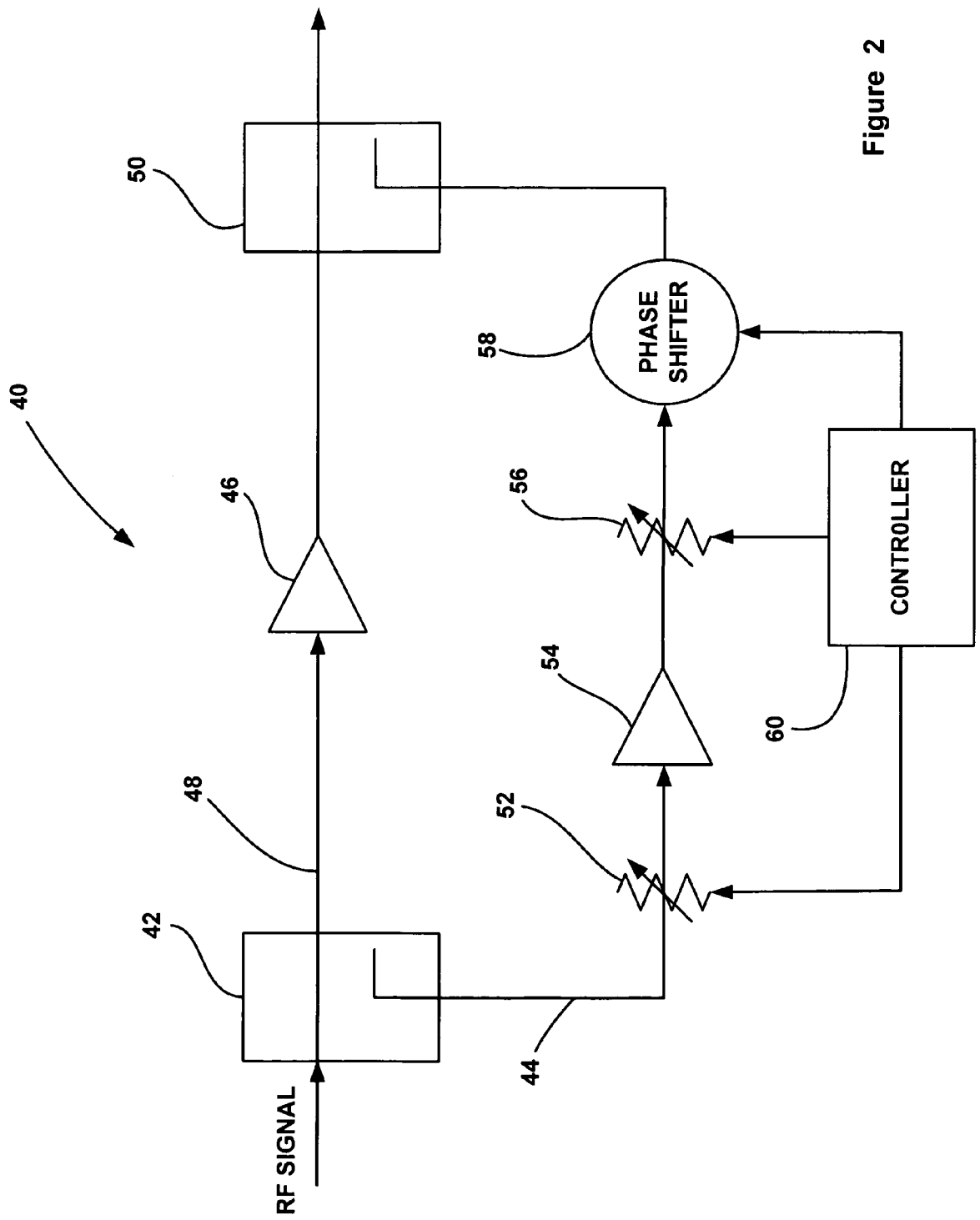
FIG. 2 is a schematic block diagram of a power amplifier circuit employing a feed forward error correction loop for amplifying an RF signal, according to an embodiment of the present invention.

FIG. 2 is a schematic diagram of a power amplifier circuit 40, according to an embodiment of the present invention, for use in a transmitter or the like. An RF signal to be transmitted having a certain main center frequency is sent through a splitter or directional coupler 42 that samples off a portion of the RF signal and applies it to a feed forward error correction loop 44. Most of the RF signal propagates through the coupler 42 to be amplified by a linear main power amplifier 46 on a main signal path 48. The power amplifier 46 can be any power amplifier suitable for the purposes described herein, such as a high gain, high IP3 (60 dBc) amplifier providing 10 dB of signal gain.

As discussed above, the amplifier 46 provides an amplified RF signal including third order intermodulation products and other signal distortions generated by the amplifying process that need to be cancelled before the RF signal is transmitted. For example, if two equal intensity signal tones at center frequencies $f_1$ and $f_2$ are applied to the amplifier 46, where $f_1$ is lower in frequency than $f_2$ and where $f_2-f_1=f_x$, the amplifier 46 will generate two third order intermodulation products at frequencies $2f_1-f_2$ and $2f_2-f_1$. For a specific IP3 value, the two third order intermodulation frequencies satisfy the equation:

$$IP3=dBc/2+P_{out}$$

Where $P_{out}$ is the power intensity of the signal tones at frequencies $f_1$ and $f_2$ and dBc is the difference in amplitude between the $2f_1-f_2$ intermodulation product and the signal tone $f_1$ or the difference in amplitude between the $2f_2-f_1$ intermodulation product and the signal tone $f_2$. For the amplifier 46, the intermodulation products have a signal intensity of −50 dBm and are 60 dBc below the intensity of the signal tones at frequencies $f_1$ and $f_2$.

The amplified RF signal is applied to a directional coupler 50 on the main signal path 48 for purposes of canceling out the intermodulation products in the amplified RF signal, as will be discussed in detail below. In one embodiment, the coupler 50 is a 10 dB coupler, however, this is by way of a non-limiting example in that other couplers can be employed within the scope of the present invention.

The sampled RF signal from the coupler 42 is applied to a variable error loop input attenuator 52 in the error correction loop 44 to attenuate the sampled RF signal for reasons that will become apparent from the discussion below. According to the invention, the attenuator 52 attenuates the sampled RF signal in a manner that causes the power level of the intermodulation products in the sampled RF signal propagating through the error correction loop 44 to decrease more than the power level of the main frequency of the sampled RF signal propagating through the error loop 44. In one embodiment, the intermodulation products decrease in power 3 dB and the main frequency decreases in power 1 dB for each 1 dB of attenuation.

The attenuated RF signal from the attenuator 52 is applied to an error correction amplifier 54 in the error correction loop 44. According to the invention, the amplifier 54 is different than the amplifier 26 above because it can be a low gain, low IP3 value amplifier, thus providing a significant savings in cost. In one non-limiting example, the error correction amplifier 54 has an IP3 value of 40 dBc.

Because the amplifier 54 has a low IP3 value, the amplifier 54 will produce intermodulation products that have greater amplitudes than the intermodulation products produced by the main power amplifier 46 relative to the gain of the main frequency. Because the amplifier 54 is low gain, the magnitude of the main signal amplification provided by the amplifier 54 will be considerably less than the magnitude of the main signal amplification provided by the amplifier 46. In other words, the amplifier 46 produces desired main tones at some amplitude level, and undesired intermodulation products at a lower magnitude. The difference between the magnitude of the main frequency and the magnitude of the intermodulation products in the main RF signal will be much greater than the difference between the magnitude of the main frequency and the magnitude of the intermodulation products in the sampled RF signal. By carefully selecting the power level of the sampled RF signal applied to the amplifier 54 by the attenuator 52, the magnitude of the intermodulation products produced by the amplifier 54 can be made about the same as the magnitude of the intermodulation products produced by the amplifier 46.

The increased amplitude of the intermodulation products produced in the error correction loop 44 means that no additional amplification of the intermodulation products in the main path 48 will be needed to provide adequate main power amplifier intermodulation product cancellation. In addition, because the power level of the main frequency of the sampled RF signal is very low coming out of the amplifier 54, it will produce an insignificant cancellation effect of the main frequency of the main RF signal from the amplifier 46, so that no circuitry is needed to eliminate the frequency of the RF signal in the error correction loop 44 before it is coupled to the main signal path 48 to cancel the intermodulation products generated by the amplifier 46.

The RF signal from the amplifier 54 is applied to a variable error loop output attenuator 56. The attenuator 56 will cause the magnitude of both the intermodulation products and the main frequency of the RF signal from the error correction loop amplifier 54 to increase 1 dB for each 1 dB of attenuation. The attenuator 56 provides a power level compensation that equalizes the power level of the intermodulation products of the sampled RF signal in the error correction loop 44 to the power level of the intermodulation products of the main RF signal in the main signal path 48, and compensates for differences in power gain between the main path 48 and the error correction loop 44. In other words, the attenuator 56 reduces the magnitude of both the intermodulation products and the main frequency of the RF signal so that the magnitude of the intermodulation products in the RF signal from the amplifier 54 are substantially equal in intensity to the magnitude of the intermodulation products in the RF signal from the amplifier 46. Because the magnitude of the main frequency of the RF signal from the amplifier 54 is considerably less than the magnitude of the main frequency of the RF signal from the amplifier 46, its attenuation by the attenuator 56 is unimportant.

The RF signal from the attenuator 56 is applied to a variable phase shifter 58 that phase shifts the sampled RF signal to be 180° out of phase with the main RF signal on the main signal path 48. In other embodiments, the phase shifter 58 may be able to be located at other locations in the error correction loop 14. The phase shifted RF signal from the phase shifter 58 is then applied to the coupler 50 so that the intermodulation products in the amplified signal from the amplifier 46 are cancelled because they are out of phase with the intermodulation products in the RF signal from the error correction loop. Thus, the output of the circuit 40 is an amplified RF signal substantially free of intermodulation products. Because the main frequency of the RF signal in the error correction loop 14 is out of phase with the main frequency of the RF signal in the main path 48, the RF signal in the path 48 after the coupler 50 is reduced. For the values discussed herein, the main frequency of the RF signal is about 9.9356 dBm. A controller 60 controls the attenuation of the attenuators 52 and 56 and the phase shift of the phase shifter 58 consistent with the discussion above.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A power amplifier circuit for amplifying an RF signal, said circuit comprising:
   a splitter for splitting the RF signal into a main RF signal directed onto a main power amplifier path and a sampled RF signal directed onto an error correction path;
   a main power amplifier in the main power path for amplifying the main RF signal;
   a first attenuator in the error correction path for attenuating the sampled RF signal;
   an error correction amplifier in the error correction path for amplifying the attenuated and sampled RF signal from the first attenuator;
   a second attenuator in the error correction path for attenuating the amplified and sampled RF signal from the error correction amplifier;
   a phase shifter in the error correction path for phase shifting the sampled RF signal; and
   a coupler in the main power path for coupling the amplified main RF signal from the main power amplifier and the sampled RF signal from the error correction path to cancel out intermodulation products in the amplified main RF signal.

2. The circuit according to claim 1 wherein the error correction amplifier generates greater amplitude intermodulation products of the sampled RF signal than the amplitude of the intermodulation products generated by the main power amplifier relative to the amplification of a main frequency of the sampled RF signal and the main RF signal.

3. The circuit according to claim 2 wherein the magnitude of the main frequency of the main RF signal is substantially greater than the magnitude of the main frequency of the sampled RF signal, and the magnitude of the intermodulation products of the main RF signal and the sampled RF signal are about the same.

4. The circuit according to claim 1 wherein the first attenuator provides a 3 dB decrease in the magnitude of intermodulation products in the sampled RF signal for each 1 dB of attenuation and provides a 1 dB decrease in magnitude of a main frequency of the sampled RF signal for each 1 dB of attenuation.

5. The circuit according to claim 1 wherein the second attenuator provides a 1 dB decrease in the magnitude of both intermodulation products and a main frequency of the sampled RF signal for each 1 dB of attenuation.

6. The circuit according to claim 1 wherein the main power amplifier is a high gain, high IP3 amplifier and the error correction amplifier is a low gain, low IP3 amplifier.

7. The circuit according to claim 6 wherein the main power amplifier has an IP3 value of 60 dBc and the error correction amplifier has an IP3 value of 40 dBc.

8. The circuit according to claim 1 wherein the phase shifter is positioned in the error correction path after the second attenuator.

9. The circuit according to claim 1 wherein the first attenuator and the second attenuator are variable attenuators.

10. The circuit according to claim 1 wherein the phase shifter is a variable phase shifter.

11. The circuit according to claim 1 wherein the coupler is a 10 dB coupler.

12. The circuit according to claim 1 wherein the circuit is part of an RF communications system.

13. A power amplifier circuit for amplifying an RF signal having a main center frequency, said circuit comprising:
    a splitter for splitting the RF signal into a main RF signal directed onto a main power amplifier path and a sampled RF signal directed onto an error correction path;
    a main power amplifier in the main power path for amplifying the main RF signal, said main power amplifier amplifying the main frequency of the main RF signal and generating intermodulation products of the main frequency of the main RF signal;
    an error correction amplifier in the error correction path for amplifying the sampled RF signal, said error correction amplifier amplifying the main frequency of the sampled RF signal and generating intermodulation products of the main frequency of the sampled RF signal, wherein the main power amplifier provides substantially more gain to the main frequency of the main RF signal than the gain provided by the error correction amplifier to the main frequency of the sampled RF signal, and wherein the main power amplifier and the error correction amplifier provide about the same magnitude of the intermodulation products in the main RF signal and the sampled RF signal;
    a first variable attenuator in the error correction path for attenuating the sampled RF signal, said first attenuator being positioned in the error correction path before the error correction amplifier, said first attenuator attenuating the intermodulation products in the sampled RF signal more than the attenuation of the main frequency of the sampled RF signal;
    a second variable attenuator in the error correction path for attenuating the sampled RF signal from the error correction amplifier, said second attenuator attenuating the intermodulation products and the main frequency of the sampled RF signal about the same;

a variable phase shifter in the error correction path for phase shifting the sampled RF signal from the second attenuator, said variable phase shifter causing the sampled RF signal to be substantially 180° out of phase with the main RF signal; and a coupler in the main power path for coupling the main RF signal and the sampled RF signal from the phase shifter to cancel out the intermodulation products in the main RF signal.

14. The circuit according to claim 13 wherein the first attenuator provides a 3 dB decrease in the magnitude of the intermodulation products in the sampled RF signal for each 1 dB of attenuation and provides a 1 dB decrease in the magnitude of the main frequency of the sampled RF signal for each 1 dB of attenuation.

15. The circuit according to claim 14 wherein the second attenuator provides a 1 dB decrease in both the intermodulation products and the main frequency of the sampled RF signal for each 1 dB of attenuation.

16. The circuit according to claim 13 wherein the main power amplifier is a high gain, high IP3 amplifier and the error correction amplifier is a low gain, low IP3 amplifier.

17. The circuit according to claim 16 wherein the main power amplifier has an IP3 value of 60 dBc and the error correction amplifier has an IP3 value of 40 dBc.

18. A method for canceling intermodulation products in an amplified RF signal, said method comprising:

a splitter for splitting an RF signal into a main RF signal and a sampled RF signal, said RF signal having a main center frequency;

directing the main RF signal onto a main power amplifier path;

directing the sampled RF signal onto an error correction path;

amplifying the main RF signal by a main power amplifier in the main power path to generate the amplified RF signal having intermodulation products;

attenuating the sampled RF signal in a first attenuator in the error correction path;

amplifying the attenuated and sampled RF signal by an error correction amplifier in the error correction path;

attenuating the amplified and sampled RF signal by a second attenuator in the error correction path;

phase shifting the attenuated and sampled RF signal in the error correction path; and combining the amplified RF signal and the phase shifted and sampled RF signal to cancel out the intermodulation products in the amplified main RF signal.

19. The method according to claim 18 wherein amplifying the attenuated and sampled RF signal includes generating greater amplitude intermodulation products of the sampled RF signal than the amplitude of the intermodulation products generated by the main power amplifier relative to the amplification of the main frequency of the sampled RF signal and the main RF signal.

20. The method according to claim 19 wherein the magnitude of the main frequency of the main RF signal is substantially greater than the magnitude of the main frequency of the sampled RF signal, and the magnitude of the intermodulation products of the main RF signal and the sampled RF signal are about the same.

21. The method according to claim 18 wherein the first attenuator provides a 3 dB decrease in the magnitude of intermodulation products in the sampled RF signal for each 1 dB of attenuation and provides a 1 dB decrease in magnitude of the main frequency of the sampled RF signal for each 1 dB of attenuation.

22. The method according to claim 18 wherein the second attenuator provides a 1 dB decrease in the magnitude of both intermodulation products and the main frequency of a sampled RF signal for each 1 dB of attenuation.

23. The method according to claim 18 wherein the main power amplifier is a high gain, high IP3 amplifier and the error correction amplifier is a low gain, low IP3 amplifier.

24. The method according to claim 23 wherein the main power amplifier has an IP3 value of 60 dBc and the error correction amplifier has an IP3 value of 40 dBc.

* * * * *